United States Patent
Sumi et al.

(10) Patent No.: US 7,562,968 B2
(45) Date of Patent: Jul. 21, 2009

(54) PIEZOELECTRIC ELEMENT, LIQUID-JET HEAD AND LIQUID-JET APPARATUS

(75) Inventors: Koji Sumi, Nagano-ken (JP); Hironobu Kazama, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 469 days.

(21) Appl. No.: 11/390,303

(22) Filed: Mar. 28, 2006

(65) Prior Publication Data

US 2006/0232639 A1    Oct. 19, 2006

(30) Foreign Application Priority Data

Mar. 30, 2005    (JP)    ............... 2005-097325

(51) Int. Cl.
*B41J 2/045* (2006.01)
*H01L 41/00* (2006.01)

(52) U.S. Cl. .................. 347/68; 347/70; 310/311; 310/321

(58) Field of Classification Search .............. 347/70, 347/71
See application file for complete search history.

(56) References Cited

U.S. PATENT DOCUMENTS 6,097,133 A * 8/2000 Shimada et al. ............ 310/358
6,779,878 B2 * 8/2004 Higuchi et al. ............... 347/70

FOREIGN PATENT DOCUMENTS

| EP | 0 764 992 | A1 | 3/1997 |
|---|---|---|---|
| JP | 10-081016 | A | 3/1998 |
| JP | 11-233844 | A | 8/1999 |
| JP | 2000-199049 | A | 7/2000 |
| JP | 2001-223403 | A | 8/2001 |
| JP | 2002-503768 | A | 2/2002 |
| WO | WO 99/42282 | A1 | 8/1999 |

OTHER PUBLICATIONS

Taekjib Choi et al., "Structural and dielectric properties of artificial PbZrO3/PbTiO3 superlattices grown by pulsed laser deposition", Thin Solid Films, Elsevier, vol. 2005, No. 475, Sep. 11, 2004, pp. 283-286.
Anonymous, "Small & Wide Range X-Ray Diffractometer" The Rigaku Journal, 1997, pp. 42-45, vol. 14 XP002388665.

* cited by examiner

*Primary Examiner*—K. Feggins
*Assistant Examiner*—Lisa M Solomon
(74) *Attorney, Agent, or Firm*—Sughrue Mion, PLLC

(57) ABSTRACT

Disclosed are a piezoelectric element which can obtain a large strain with a low drive voltage, a liquid-jet head and a liquid-jet apparatus. The piezoelectric element includes: a lower electrode; an upper electrode; and a piezoelectric film which is made of lead zirconate titanate (PZT), and which has perovskite crystals having priority orientations of the (100) plane, the piezoelectric film being interposed between the lower electrode and the upper electrode. In the piezoelectric element, an X-ray diffraction peak position derived from the (100) planes of the piezoelectric film is within a range of $2\theta=21.79$ to $21.88$.

10 Claims, 4 Drawing Sheets

PIEZOELECTRIC ELEMENT, LIQUID-JET HEAD AND LIQUID-JET APPARATUS

The entire disclosure of Japanese Patent Application No. 2005-097325 filed Mar. 30, 2005 is expressly incorporated by reference herein.

FIELD OF THE INVENTION

The present invention relates to a piezoelectric element including a lower electrode, a piezoelectric film and an upper electrode. Additionally, the present invention relates to a liquid-jet head which includes the piezoelectric element and ejects droplets from nozzle orifices, and to a liquid-jet apparatus.

DESCRIPTION OF THE PRIOR ART

A piezoelectric element used for a liquid-jet head and the like is an element in which a piezoelectric film is interposed between two electrodes, the piezoelectric film being made of a piezoelectric material showing an electric mechanical conversion function. The piezoelectric film is composed of, for example, crystallized piezoelectric ceramics.

There has been an inkjet recording head with the following configuration. In accordance with the configuration, a part of pressure generating chambers communicating with nozzle orifices from which ink droplets are ejected is constructed with a vibration plate. The vibration plate is deformed by piezoelectric elements, and thus ink in each of the pressure generating chambers is pressurized. Accordingly, ink droplets are ejected from each of the nozzle orifices. Two types of ink-jet recording heads have been put into practical use. One type uses a piezoelectric actuator of a longitudinal vibration mode in which the piezoelectric actuator expands and contracts in a longitudinal direction of a piezoelectric element. One other type uses a piezoelectric actuator of a flexure vibration mode. With respect to such actuators, a piezoelectric element which can obtain a large distortion with a low drive voltage for the purpose of disposing the piezoelectric elements with a high density is required. In other words, a piezoelectric element with a large displacement has been required.

Incidentally, for the purpose of making piezoelectric constant larger and eliminating variations, piezoelectric elements each of which is provided with lead zirconate titanate (PZT) and electrodes have been disclosed. One of the piezoelectric elements has a perovskite structure and contains PZT with a composition ratio of Zr and Ti to have rhombohedral crystals at a room temperature. In this case, crystals are oriented in a manner that the [100], [010] or [001] direction is almost perpendicular to the face surface of the electrodes. One other of the piezoelectric elements has a perovskite structure and contains PZT with a composition ratio of Zr and Ti to have tetragonal crystals at a room temperature. In this case, PZT has a crystal orientation with which the [001] direction is almost perpendicular to the face surface of the electrodes (see Japanese Patent Laid-open Official Gazette No. Hei 11-233844). However, it has not been possible to obtain a sufficient displacement with such piezoelectric elements. Note that, such problems are not limited to liquid-jet heads represented by inkjet recording heads. The problems are similarly present in other piezoelectric elements.

SUMMARY OF THE INVENTION

With the aforementioned conditions taken into consideration, an object of the present invention is to provide a piezoelectric element, which can obtain a large distortion with a low drive voltage, a liquid-jet head and a liquid-jet apparatus.

A first aspect of the present invention for the purpose of solving the aforementioned problems is a piezoelectric element characterized by including: a lower electrode; an upper electrode; and a piezoelectric film which is made of lead zirconate titanate (PZT) and which has perovskite crystals having priority orientations of the (100) plane, the piezoelectric film being interposed between the lower electrode and the upper electrode. The piezoelectric element is characterized in that a diffraction peak position of X-ray derived from the (100) planes of the piezoelectric film is within a range of $2\theta=21.79$ to $21.88$.

In the first aspect, the piezoelectric film is made of lead zirconate titanate (PZT) and has perovskite crystals having priority orientations of the (100) plane. The piezoelectric film has the diffraction peak position of X-ray derived from the (100) planes of the piezoelectric film is within a range of $2\theta=21.79$ to $21.88$. For this reason, the piezoelectric element can obtain a large strain with a low drive voltage, and has a large displacement.

A second aspect of the present invention is the piezoelectric element according to the first aspect, which is characterized in that the diffraction peak position is $2\theta=21.83$ to $21.87$.

In the second aspect, the piezoelectric element has a large displacement without fault.

A third aspect of the present invention is the piezoelectric element according to any one of the first and second aspects, which is characterized in that the piezoelectric film has a rhombohedral crystal system structure.

In the third aspect, since the piezoelectric film has the rhombohedral crystal system structure, it is possible to obtain a large distortion with a low voltage.

A fourth aspect of the present invention is the piezoelectric element according to any one of the first to third aspects, which is characterized in that the piezoelectric film contains at least any one selected from the group consisting of Sc, Y, Th, lanthanoids and actinoids.

In the fourth aspect, the piezoelectric film contains at least any one selected from the group consisting of Sc, Y, Th, lanthanoids and actinoids. For this reason, a distortion tends to occur, thereby the displacement of the piezoelectric element becomes larger.

A fifth aspect of the present invention is a liquid-jet head characterized by including: the piezoelectric element according to any one of first to fourth aspects; and a passage-forming substrate to which the piezoelectric element is provided with a vibration plate interposed in between, and in which pressure generating chambers each communicating with nozzle orifices are provided.

In the fifth aspect, a piezoelectric element which includes a piezoelectric film made of lead zirconate titanate (PZT) and has a priority orientation of the (100) plane with perovskite crystals is used. The piezoelectric film has the diffraction peak position of X-ray derived from the (100) planes of the piezoelectric film is within a range of $2\theta=21.79$ to $21.88$. For this reason, it is possible to provide the liquid-jet head which can obtain a large distortion with a low drive voltage.

A sixth aspect of the present invention is a liquid-jet apparatus characterized by including the liquid-jet head according to the fifth aspect.

According to the sixth aspect, it is possible to provide a liquid-jet apparatus in which a characteristic of ejecting droplets is significantly improved.

DESCRIPTION OF THE PREFERRED EMBODIMENTS

Hereinafter, detailed descriptions will be provided for the present invention on a basis of embodiments.

FIRST EMBODIMENT

Figure 1:
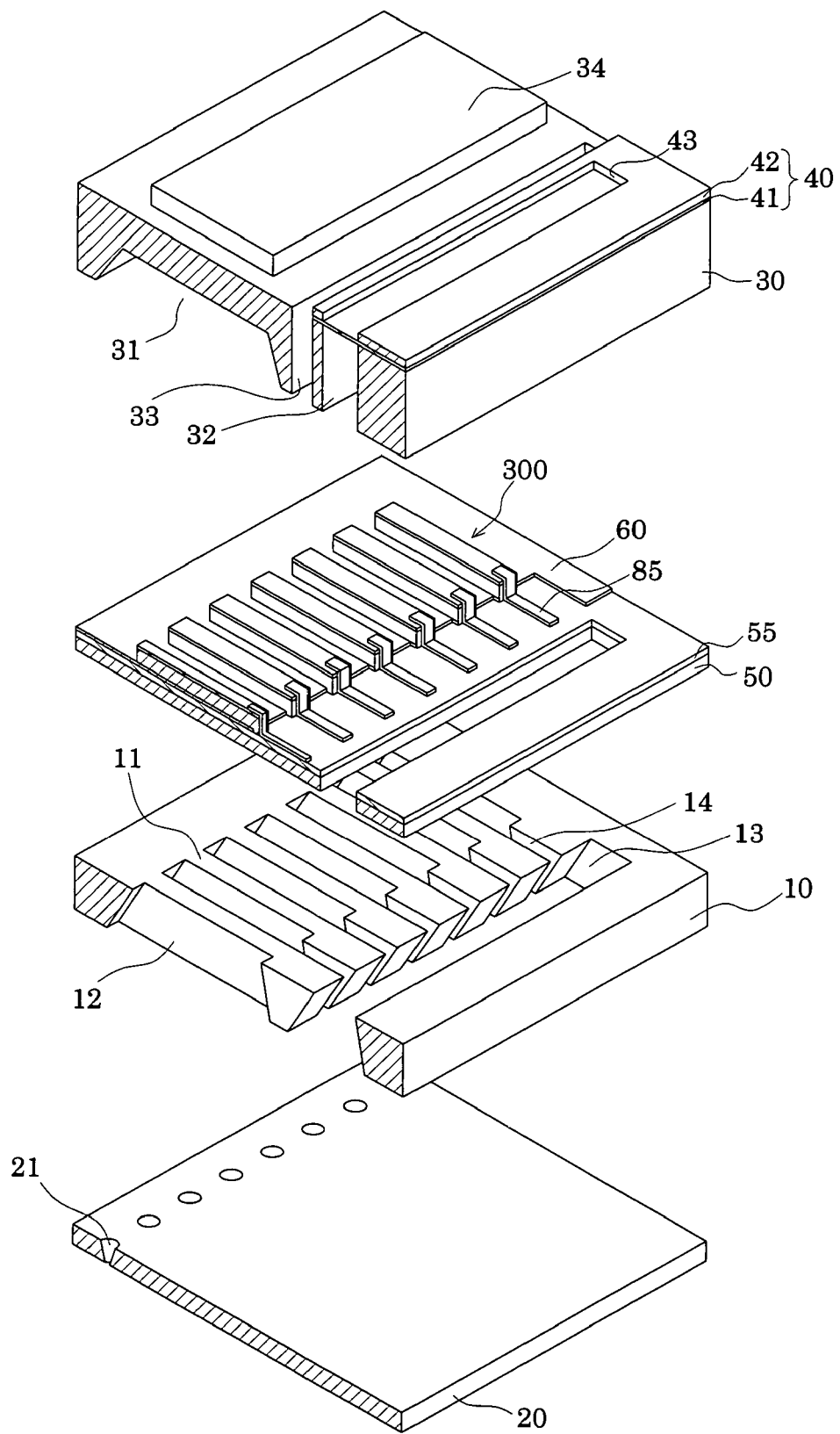
FIG. 1 is an exploded perspective view showing a liquid-jet head according to a first embodiment of the present invention.
Figure 2A:
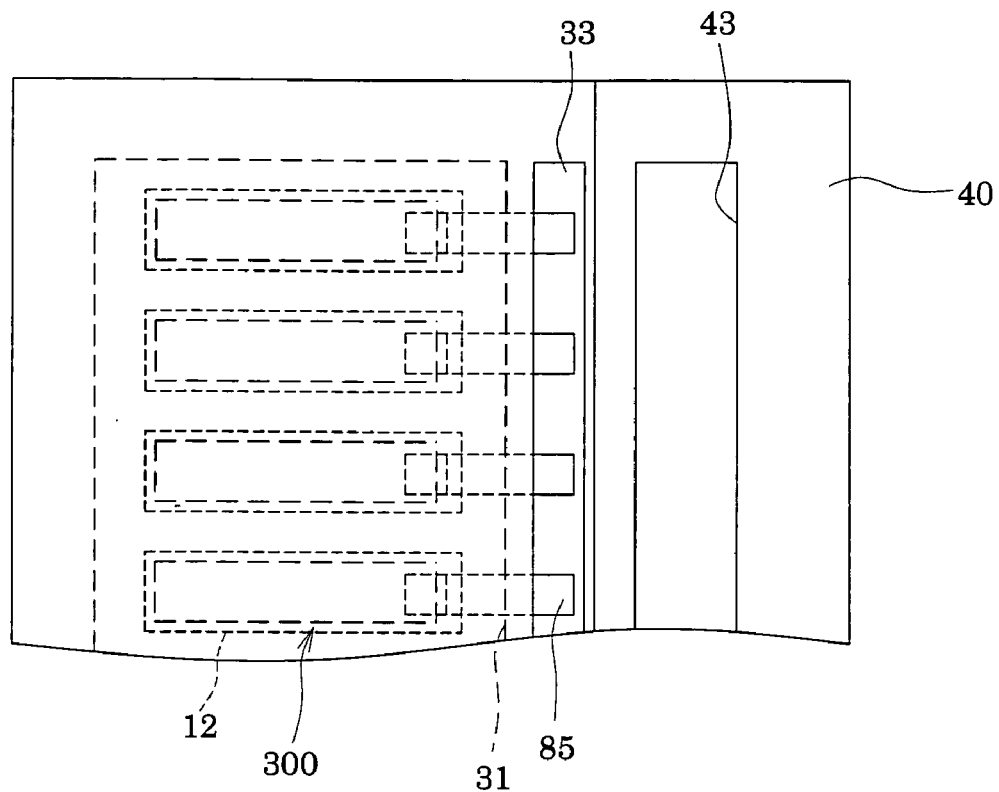
FIGS. 2A and 2B are respectively plan and cross-sectional views of the liquid-jet head according to the first embodiment of the present invention.
Figure 2B:
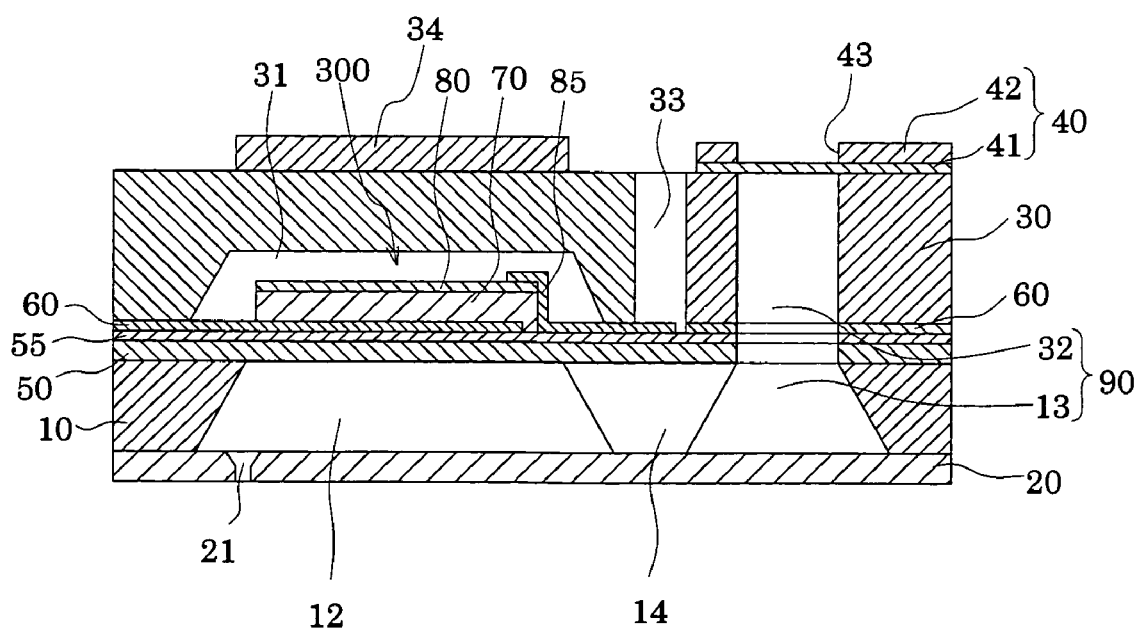

FIG. 1 is an exploded perspective view of a liquid-jet head according to a first embodiment of the present invention. FIG. 2A is a plan view of the liquid-jet head shown in FIG. 1, and FIG. 2B is a cross-sectional view of the liquid-jet head of FIG. 1.

As shown in the drawings, a passage-forming substrate 10 is formed of a single crystal silicon substrate where silicon crystals on the face surface of the substrate are in the (110) plane direction, in this embodiment. An elastic film 50 is formed on one of the two surfaces of the passage-forming substrate 10. The elastic film 50 has a thickness of 0.5 to 2 μm and is made of silicon dioxide. Note that, in this embodiment, the elastic film 50 is an amorphous silicon film made of silicon oxide formed by means of thermally oxidizing the passage-forming substrate 10. The elastic film 50 has a flat surface while maintaining the surface state of the passage-forming substrate 10 as it was.

In the passage-forming substrate 10, a plurality of pressure generating chambers 12 compartmentalized by compartment walls 11 are arranged side-by-side by means of anisotropically etching the single crystal silicon substrate from the other surface thereof. Outside the pressure generating chambers 12 in the longitudinal direction, a communicating portion 13 is formed. The communicating portion 13 communicates with a reservoir portion 32 of a protection plate 30 which will be described later. Additionally, the communicating portion 13 communicates with one end of each of the pressure generating chambers 12 in the longitudinal direction through its corresponding ink supply path 14.

In this respect, the anisotropic etching is performed by use of a difference in etching rate of single crystal silicon substrate. In this embodiment, for example, the anisotropic etching is performed by use of characteristics of the single crystal silicon substrate. The characteristics are as follows. When the single crystal silicon substrate where silicon crystals on the face surface of the substrate are in the (110) plane direction is dipped in an alkaline solution such as KOH, the single crystal silicon substrate gradually erodes. Thereby, first (111) planes and second (111) planes gradually emerge. Each of the first (111) planes is perpendicular to the (110) plane, and the second (111) plane has 70 degree and 35 degree angles respectively on the first (111) plane and the (110) plane. The etching rate of the (110) plane is approximately one hundred eightieth to the rate of etching the (111) plane. Because of the anisotropic etching, a parallelogram-shaped depth is formed of two of the first (111) planes and two of the oblique second (111) planes. Based on the processing for the depth, it is possible to form the depth with precision, whereby pressure generating chambers 12 can be arranged with high density.

In this embodiment, each long side of each of the pressure generating chambers 12 is formed with the first (111) planes. Each short side of each of the pressure generating chambers 12 is formed with the second (111) planes. The pressure generating chambers 12 are formed by means of etching the passage-forming substrate 10 in a manner that the pressure generating chambers 12 reach the elastic film 50 while almost penetrating the passage-forming substrate 10. In this regard, quite small portion of the elastic film 50 is soaked with the alkaline solution for etching the single crystal silicon substrate. In addition, each of the ink supply paths 14 communicating with one end of each of the pressure generating chambers 12 is formed with a width narrower than that of the pressure generating chamber 12, and thus keeps constant the passage resistance of ink flowing into the pressure generating chambers 12.

It is preferable to select an appropriate thickness for the passage-forming substrate 10, in which such pressure generating chambers 12 and the like are formed, in accordance with the density with which pressure generating chambers 12 are arranged. For example, in a case where 180 pressure generating chambers 12 are formed per inch (180 dpi), the thickness of the passage-forming substrate 10 is preferably approximately 180 to 280 μm, more preferably approximately 220 μm. In a case where the pressure generating chambers 12 are formed relatively densely for example at 360 dpi, the thickness of the passage-forming substrate 10 is preferably not larger than 100 μm. It is because, with the thicknesses mentioned above, it is possible to maintain rigidity of the compartment walls 11 between the pressure generating chambers 12 while increasing the density of forming the adjacent pressure generating chambers 12.

In addition, a nozzle plate 20 is adhered to an aperture surface of the passage-forming substrate 10 with an adhesive agent, a thermal adhesive film or the like interposed in between. In the nozzle plate 20, nozzle orifices 21 are drilled. The nozzle orifices 21 communicate respectively with the pressure generating chambers 12 at the opposite side of the pressure generating chambers 12 to the ink supply paths 14.

On the other hand, an orientation control layer 55 in which crystals are oriented to the (100) plane direction is formed on the elastic film 50 opposite an aperture surface of the passage-forming substrate 10. This orientation control layer 55 is made of perovskite, metal oxide or the like. It is possible to form perovskite by applying, drying and baking a precursor of perovskite by use of a MOD method or a sol-gel method. The perovskite freely grows on the amorphous elastic film 50 formed of silicon oxide or the like, thus a film wherein crystals are oriented to the (100) plane direction is formed. In this respect, metal oxide is formed, for example, by use of a sputtering method or the like.

Such an orientation control layer 55 becomes a film in which crystals are oriented to the (100) plane direction. If the elastic film 50 below the orientation control layer 55 has the flat face surface, variations in orientation are significantly reduced. Accordingly, the orientation control layer 55 efficiently controls orientation of a film formed thereon. Furthermore, in particular, the perovskite freely growing from the face surface (upper surface) thereof is hardly affected by the face surface flatness of the elastic film 50 which is a lower layer of the orientation control layer 55. For this reason, perovskite is particularly preferable for controlling orientation of a film to be formed thereon.

As perovskite, $KNbO_3$, $BaSnO_3$, $CaZrO_3$, $SrCeO_3$, $BaTiO_3$, $SrRuO_3$, $LiNbO_3$, $LiTaO_3$, $KTaO_3$, $CaTiO_3$, or the like can be taken as examples. However, it is not limited to them. Among them, $BaTiO_3$, $KNbO_3$, $LiNbO_3$ are especially preferable because each of them freely grows from the face surface (upper surface) thereof.

Additionally, magnesium oxide (MgO) can be taken as an example of metal oxide, for instance.

It is preferable that a lattice constant of such perovskite or metal oxide is within a range of 3.86±0.3 Å. This is for facilitating lattice matching with a lower electrode to be formed on such perovskite or metal oxide as it will be described later. For example, the lattice constant of platinum used as the lower electrode is 3.92 Å and the lattice constant of iridium is 3.8 Å. Accordingly, the difference between these lattice constants and a lattice constant of such perovskite or metal oxide is in a range of 5% to 6%. Thereby, the lower electrode epitaxially grows easily, and thus the orientation of crystals of the lower electrode is controlled.

The crystal system of perovskite or metal oxide is preferably the cubic system, the tetragonal system, or the monoclinic system. The reason for it is that the formation of crystal lattice of perovskite or metal oxide matches the formation of crystal lattice of metal of a lower electrode to be formed thereon, if the metal of the lower electrode has the cubic system.

Note that such an orientation control layer 55 may have a thickness of approximately 5 to 100 nm. In this regard, in this embodiment, the orientation control layer 55 is formed directly on the elastic film 50. However, it is also possible to form one other layer on the elastic film 50 made of silicon oxide and then form the orientation control layer 55 on the one other layer, if the one other layer satisfies the condition that the layer can maintain the face surface state while being amorphous. Alternatively, if the orientation control layer 55 crystalize from the face surface (upper surface) side thereof and is not significantly affected by the face surface flatness of the elastic film 50 which is below the orientation control layer 55, one other layer may be provided on the elastic film 50 on the condition that the one other layer has no effect on the crystal orientation of the orientation control layer 55.

A lower electrode film 60, piezoelectric films 70 and upper electrode films 80 are laminated on such an orientation control film 55 to constitute a piezoelectric film 300 by use of the below-described process. The lower electrode film 60, one piezoelectric film 70 and one upper electrode film 80 constitute each of piezoelectric elements 300. The lower electrode film 60, each of the piezoelectric films 70, and each of the upper electrodes 80 have thicknesses of, for example, approximately 0.2 μm, 1 μm, and 0.05 μm respectively. In this regard, the piezoelectric element 300 is referred to as a portion including the lower electrode film 60, one piezoelectric film 70 and one upper electrode film 80. In general, the piezoelectric element 300 is configured in the following manner. One of the two electrodes of the piezoelectric element 300 is used as a common electrode. The other electrode and the piezoelectric film 70 are patterned in each of the pressure generating chambers 12. In a portion constituted of a patterned one of the two electrodes, and a patterned piezoelectric layer 70 when a voltage is applied to the both electrodes, a piezoelectric strain occurs. This portion is called a "piezoelectric active portion". In this embodiment, the lower electrode film 60 is used as a common electrode for the piezoelectric elements 300, and the upper electrode films 80 are used as individual electrodes of the piezoelectric elements 300. However, it does not matter if they are used vice versa for the conveniences of a drive circuit and interconnects. In both cases, the piezoelectric active portions are formed in each of the pressure generating chambers. In addition, a combination of one piezoelectric element 300 and a vibration plate is called a "piezoelectric actuator." The vibration plate displaces depending on a drive of the piezoelectric element 300.

Incidentally, lead electrodes 85 are respectively connected to the upper electrode films 80 of the piezoelectric elements 300. The lead electrodes 85 are made of, for example, gold or the like. Each of the lead electrodes 85 is extended from the vicinity of an end of the piezoelectric element 300 in the longitudinal direction to a region corresponding to the ink supply path 14. Additionally, although as described in detail later, such lead electrodes 85 are electrically connected to a drive IC.

Incidentally, the above-described lower electrode 60 is formed of metal selected from the group consisting of gold (Au) and a platinum group metal such as iridium (Ir), platinum (Pt), palladium (Pd) and the like. The lower electrode 60 may be a laminated layer of a plurality of layers. Note that in a case of this laminated layers, it does not matter if they may result in a mixed layer of the above metals in a subsequent processing. In this embodiment, the lower electrode 60 is formed in a manner that Pt, Ir and Pt are laminated in order from the orientation control layer 55 side to form a lamination film. Instead of the above-described gold (Au) and a platinum group metal, a material such as $SrRuO_3$, $LaNiO_3$ or the like can be also used as the lower electrode 60. The material can orient crystals of the piezoelectric film 70 to the (100) plane direction. In this case, since the lower electrode 60 also has an orientation control function, the provision of the orientation control layer 55 is not required.

The lower electrode 60 is controlled in order to orient crystals thereof to the (100) plane direction by the orientation control layer 55, wherein crystals are oriented to the (100) plane direction. In other words, as described, especially in the case where the lattice constant of the orientation control layer 55 is close to that of the lower electrode 60, the lower electrode 60 epitaxially grows, whereby the lower electrode 60 is almost entirely controlled so as to make crystals thereof have the (100) plane direction.

Furthermore, in a case where the crystal system of perovskite consisting the orientation control layer 55 is the cubic system, the tetragonal system or the monoclinic system, the lower electrode 60 epitaxially grows easily in particular since each of platinum group metal and gold has the cubic system. In other words, in this case, each of the formations of the crystals of the orientation control layer 55 and the lower electrode 60 at the interface thereof becomes a square, and matches to one another. For this reason, the lower electrode 60 can epitaxially grow in a manner that the squares are laminated.

The piezoelectric film 70 is formed on the lower electrode film 60 in which crystals are oriented to the (100) plane direction by means of epitaxial growth. Crystals of the piezoelectric film 70 are orientated to the (100) plane direction because of the influence by the plane direction of the lower electrode film 60. Note that since the crystal orientation control of the piezoelectric film 70 is achieved by the influence of that of the lower electrode 60, crystals of the piezoelectric film 70 has a priority orientation of the (100) plane in a state where variations in orientation are significantly reduced.

The piezoelectric film 70 is composed of lead zirconate titanate (Pb (Zr, Ti) $O_3$) (hereinafter referred to as "PZT"). The piezoelectric film 70 has perovskite crystals having the priority orientation of the (100) plane direction. A diffraction peak position (2 theta (θ)) derived from the (100) plane of the piezoelectric film 70 is measured by use of a wide-angled X-ray diffraction method. The diffraction peak position is within a range of 21.79 to 21.88 degrees, preferably 21.83 to 21.87 degrees, more preferably 21.85 degrees. If the X-ray diffraction peak position of 2θ derived from the (100) plane of the piezoelectric film 70 is within a range of 21.79 to 21.88 degrees, the amount of strain of the piezoelectric element is significantly improved. Additionally, if the X-ray diffraction peak position of 2θ derived from the (100) plane is within a range of 21.79 to 21.88 degrees, crystals of PZT having the priority orientation of the (100) plane and constituting the piezoelectric film become to have the rhombohedral structure. Note that "priority orientation" means a state where orientation directions of crystals are not irregular and specific crystal planes are oriented to almost uniform directions. Specifically, "to have the priority orientation of the (100) plane" means that the diffraction intensity ratio (100)/((100)+(110)+(111)) of the (100) planes, the (110) planes and the (111) planes is larger than 0.5, the ratio being obtained when the piezoelectric film is measured by use of the wide-angled X-ray diffraction method.

In this embodiment, the piezoelectric layer 70 is made of PZT. However, at least any one selected from the group consisting of scandium (Sc), yttrium (Y), thorium (Th), lanthanoids and actinoids may be further contained in the piezoelectric film. If at least one of these metals is contained in the piezoelectric film made of PZT, strain of the piezoelectric element can be further increased. The most preferable metal to be contained is Y. An amount of such metals to be contained is not particularly limited. However, it is preferable that the amount be not more than 10 at % to PZT.

Such a piezoelectric layer 70 is formed for example by use of what is termed as a sol-gel method. According to the sol-gel method, what is termed as sol is obtained by dissolving and dispersing PZT in a catalyst. This sol is coated and dried to be turned into gel. Then, the gel is sintered at a high temperature. Specifically, the piezoelectric film 70 is formed in a manner that crystals of the piezoelectric film 70 have grown while crystals thereof are oriented to the same plane direction as that of crystals of the lower electrode film 60. It goes without saying that a method of forming the piezoelectric film 70 is not particularly limited to the method mentioned above. The piezoelectric film 70 may be formed by use of a sputtering method, the MOD method or the like.

In any case, the piezoelectric film 70 is provided so that it has the priority orientation of the (100) plane. In this regard, the thickness of the piezoelectric film 70, which is manufactured in the thin film forming process as described, is generally 0.2 to 5.0 µm.

In this embodiment, the piezoelectric film 70 is formed by an epitaxial growth method. For this reason, the film is preferably formed under predetermined conditions in order to have similar crystal structure and lattice plane spacing to those of a base of the film. In addition, the piezoelectric film 70 is preferably formed to have a crystal structure with which there is no repulsion due to electrostatic interaction between the piezoelectric film 70 and the surface of the base. Incidentally, the piezoelectric layer 70 may be formed by freely growing with no control by the orientation of the base.

In this respect, the amount of lead contained in PZT constituting the piezoelectric film 70 and stress in the piezoelectric film are adjusted in the step of forming the piezoelectric film on the lower electrode, or the like. Thus, the piezoelectric film can be formed to have a crystal system with the above-described predetermined diffraction peak position. Alternatively, by adjusting the ratio of Zr and Ti in PZT, it is also possible to form the piezoelectric film having a crystal system with a predetermined diffraction peak position. Note that the crystal system of PZT may vary because of force from the lower electrode or the like.

Figure 3:
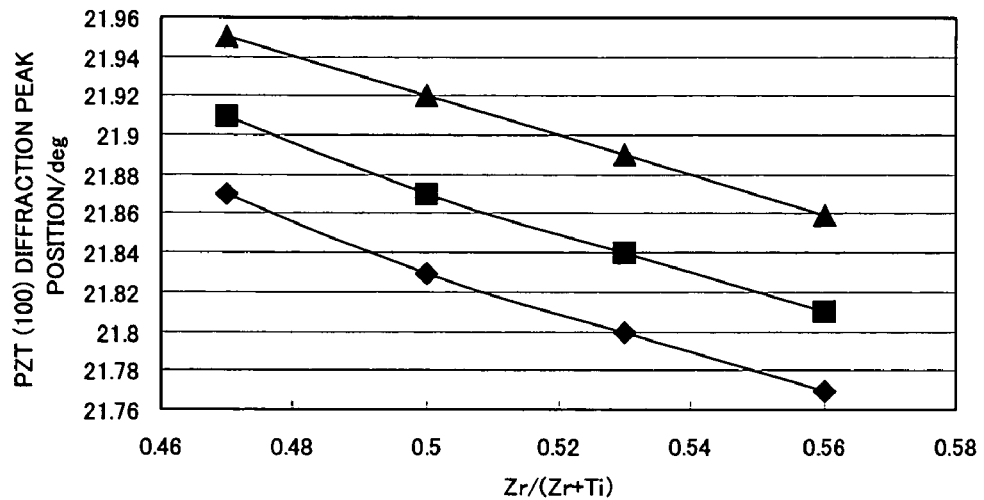
FIG. 3 is a chart showing relations among diffraction peak values, an amount of lead and Zr/(Zr+Ti).
Figure 4:
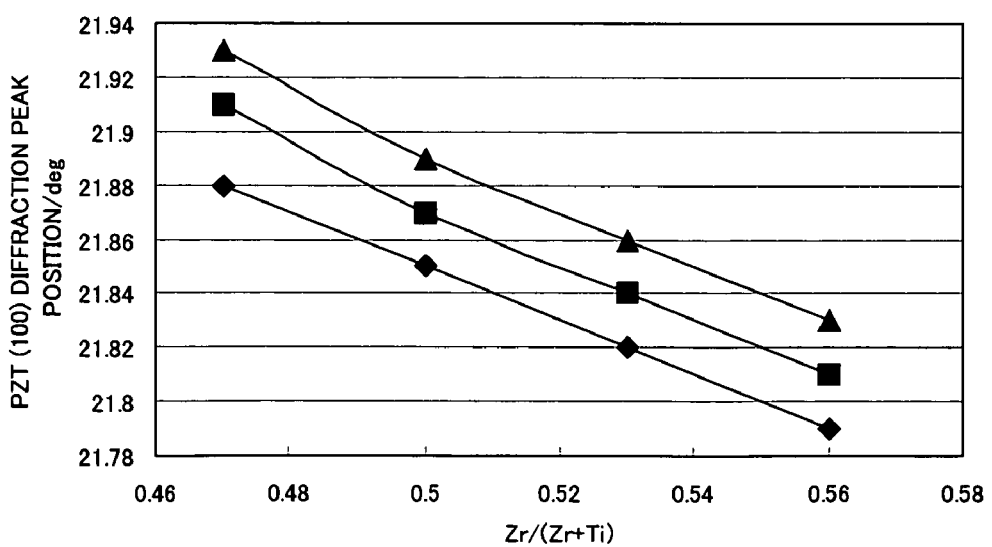
FIG. 4 is a chart showing relations among diffraction peak values, a stress of PZT in a film and Zr/(Zr+Ti).

As shown in relations between the amount of lead contained in PZT as well as Zr/(Zr+Ti) (molar ratio) and diffraction peak values in FIG. 3, for example, the diffraction peak value also varies depending on Zr/(Zr+Ti). However, even if there if no change in Zr/(Zr+Ti), the X-ray diffraction peak position derived from the (100) plane of the piezoelectric film is on a lower angle side in a case where the amount of Pb is increased. Accordingly, it is possible to form a piezoelectric layer having a crystal system with a required structure by adjusting the amount of Pb in PZT. Additionally, as shown in relations between the stress of PZT in the film as well as Zr/(Zr+Ti) (molar ratio) and the diffraction peak values in FIG. 4, even if there in no change in Zr/(Zr+Ti), the X-ray diffraction peak position derived from the (100) plane of the piezoelectric film is at a lower angle side in a case where the stress in the piezoelectric film becomes small. For this reason, it is also possible to form the piezoelectric layer having a crystal system with a required structure by changing intensity of stress in the piezoelectric film. Note that "stress in the piezoelectric film" means a tensile stress generated because the substrate is deformed in the step of being baked so as to form the piezoelectric film by means of the epitaxial growth, or the like.

In this regard, permittivity and Young's, modulus of the piezoelectric film 70 largely depend on the ratio of Zr and Ti. Accordingly, in a case where PZT has a crystal system with a predetermined X-ray diffraction peak position after the adjustment of the ratio of Zr and Ti, the permittivity and Young's modulus of the piezoelectric film 70 are substantially regulated. Thereby it is difficult to control the permittivity and Young's modulus. However, according to the present invention, with respect to the piezoelectric film constituting the piezoelectric element, it is possible to set Young's modulus and permittivity arbitrarily, even though the aforementioned film belong to the aforementioned crystal system. Additionally, it is possible to have a desired crystal system without changing the ratio of Zr and Ti.

To be specific, the piezoelectric film made of PZT is formed on the lower electrode made of $SrRuO_3$ by causing the piezoelectric film 70 to epitaxially grow while crystals thereof are oriented to the (100) plane direction. The composition of PZT is of excessive lead of 1.05 and Zr/Ti=55/45 ($Pb_{1.05}$ ($Zr_{0.55}$ $Ti_{0.45}$) $O_3$). In this case, the X-ray diffraction peak position (2θ) derived from the (100) plane is within a range of 21.88 to 21.79 degrees when stress in the film is a tensile strength of 50 to 150 MPa. In a case of this diffraction peak position, plane spacing with respect to the (100) planes is 4.05±0.03, and the crystal system thereof is rhombohedral which is close to MPB (phase boundary or the maximum region of or permittivity). Note that the lattice spacing of PZT is several percentages larger than that of the lower electrode, and a force is generated due to lattice distortion of the lower electrode when the lattice spacing above misfits.

On the other hand, the piezoelectric film made of PZT is formed on the lower electrode by causing the piezoelectric film to grow freely with crystals thereof being oriented to the (100) plane direction. Here, the PZT is composed of excessive lead of 1.10 and Zr/Ti=50/50 ($Pb_{1.10}$ ($Zr_{0.50}$ $Ti_{0.50}$) $O_3$). In this case, the X-ray diffraction peak position derived from the (100) plane (2 theta (θ)) ranging from 21.88 to 21.79 degrees when stress in the film has a tensile strength of 100 to 200 MPa. In a case of this diffraction peak position, plane spacing with respect to the (100) planes is 4.05±0.03.

Furthermore, if the piezoelectric film is formed in a manner that 0.5 at % of Y, Th or Sc is added to above-described PZT in each of the cases, the maximum distortion in each of the cases is increased by approximately 20%. Thereby, the displacement of the piezoelectric element increases.

As described, if the piezoelectric film 70 is formed to have the X-ray diffraction peak position the (100) planes (2 theta (θ)), which peak position is within the range of 21.88 to 21.79 degrees, the displacement of the piezoelectric element is increased. In addition, if metals such as Y, Th or Sc are added to the piezoelectric film 70, the displacement thereof is further increased.

Note that the wavelength λ of the above-described diffraction X-ray is λ=1.5405 Å.

Moreover, a protection plate 30 having a piezoelectric element holding portion 31 is joined to the passage-forming substrate 10 on a side of the piezoelectric elements 300. The piezoelectric element holding portion 31 has a cavity large enough for the piezoelectric elements 300 to move without hindrance. The piezoelectric elements 300 are formed in this piezoelectric element holding portion 31.

Additionally, the protection plate 30 is provided with a reservoir portion 32 constituting at least a part of a reservoir 90 which is used as a common ink chamber for each of the pressure generating chambers 12. This reservoir portion 32 communicates with the communicating portion 13 of the passage-forming substrate 10 as described above, and thus constitutes the reservoir 90 which is used as a common ink chamber for each of the pressure generating chambers 12.

Furthermore, connection hole 33 is provided between the piezoelectric element holding portion 31 and the reservoir portion 32. In other words, the connection hole 33 is provided to a region corresponding to the ink-supply paths 14. The connection hole 33 penetrates through the protection plate 30 in the thickness direction. Moreover, a drive IC 34 for driving the piezoelectric elements 300 is mounted on the opposite side of the surface of the protection plate 30 facing the piezoelectric element holding portion 31. Moreover, the lead electrodes 85 drawn out respectively from the piezoelectric elements 300 are extended to the connection hole 33 and connected to the drive IC 34, for example, with a wire bonding or the like.

A compliance plate 40 is joined to the top of the protection plate 30. The compliance plate 40 is configured of a sealing film 41 and a fixed plate 42. In this regard, the sealing film 41 is made of a flexible material with a lower rigidity (for example, a polyphenylen sulfide (PPS) film with a thickness of 6 μm). Furthermore, the fixed plate 42 is formed of a hard material such as a metal (for example, stainless steel (SUS) or the like with a thickness of 30 μm). In this region of the fixed plate 42 that faces the reservoir 90, an opening portion 43 is formed. The opening portion 43 is obtained by completely removing the region in the thickness direction. Accordingly, one side of the reservoir 90 is sealed up only by the sealing film 41 which is flexible.

Such a liquid-jet head according to this embodiment takes in ink from an exterior ink supply means which is not illustrated, and fills the interior ranging from the reservoir 90 through the nozzle orifices 21 with ink. Thereafter, the liquid-jet head applies a voltage between the lower electrode film 60 and each of the upper electrode films 80 each corresponding to the pressure generating chambers 12, in accordance with recording signals from the drive IC 34. Thus, the liquid-jet head deforms the elastic film 50, the lower electrode film 60 and the piezoelectric layers 70 with flexure. This deformation raises the pressure in each of the pressure generating chambers 12, and thereby ink droplets are ejected from the nozzle orifices 21.

OTHER EMBODIMENTS

The embodiment of the present invention has been described above. However, the configuration of the present invention is not limited to this.

Figure 5:
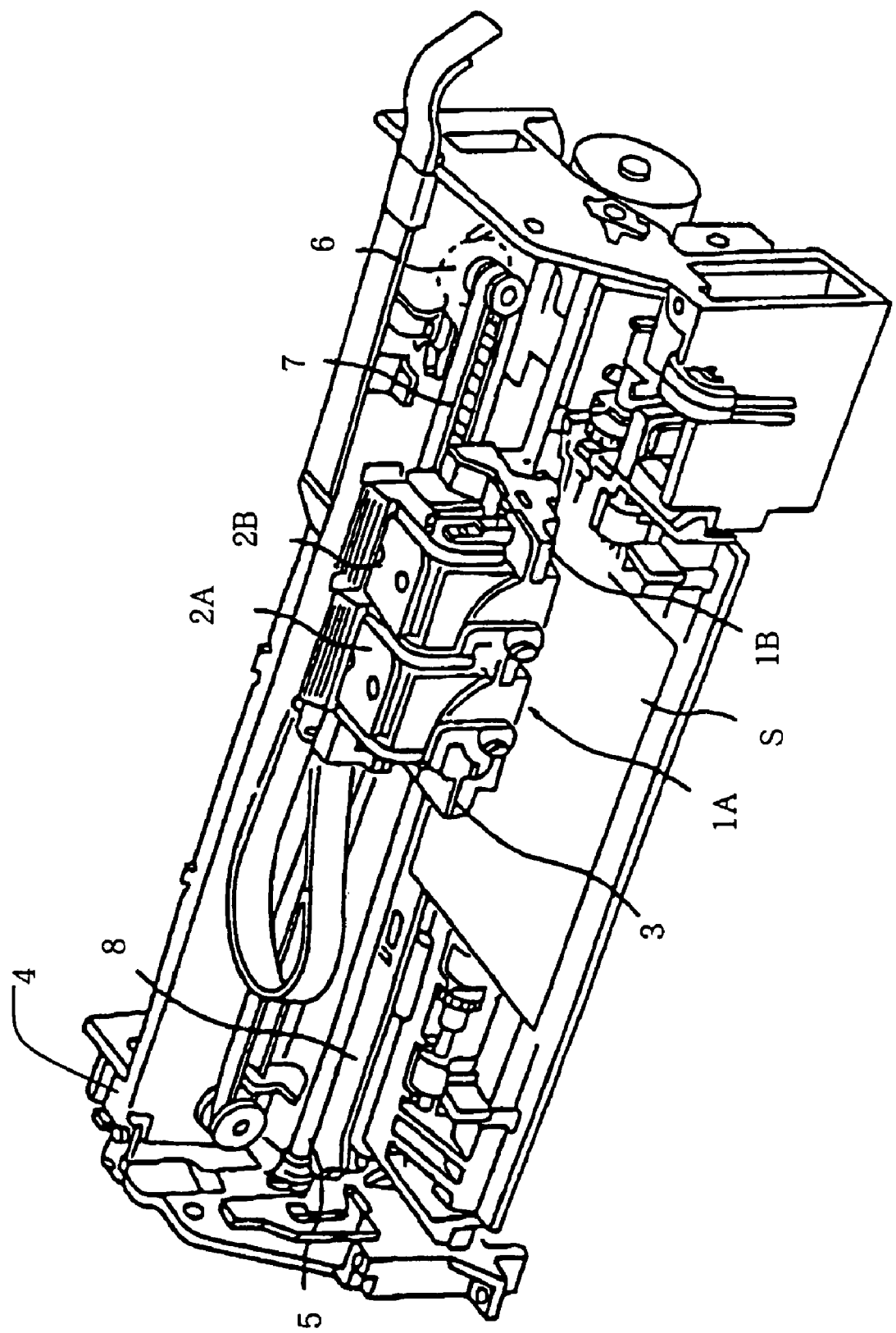
FIG. 5 is a schematic perspective view of an inkjet recording device according to an embodiment of the present invention.

In addition, the liquid-jet head according to the present invention constitutes a part of a recording head unit provided with an ink passage communicating with an ink cartridge and the like, and is installed in liquid-jet apparatus. FIG. 5 is a schematic configuration diagram showing an example of the liquid-jet apparatus.

As shown in FIG. 5, recording head units 1A and 1B including the respective liquid-jet heads are detachably provided to cartridges 2A and 2B constituting an ink supply means. A carriage 3 on which the recording head units 1A and 1B are mounted is provided to a carriage shaft 5 fixed to the device main body 4 in a way that the carriage 3 can be freely moved in the direction in which the shaft extends. These recording head units 1A and 1B are assigned to ejecting black ink compositions and color ink compositions respectively.

In addition, a drive power from a drive motor 6 is transmitted to the carriage 3 through a plurality of gears, which are not illustrated, and a timing belt 7. Thereby, the carriage 3 on which the recording head units 1A and 1B are mounted is caused to move along the carriage shaft 5. On the other hand, the device main body 4 is provided with a platen 8 along the carriage shaft 5. A recording sheet S, which is a recording medium such as a sheet of paper, and which has been fed by feed rollers and the like, is designed to be transferred on the platen 8, the feed rollers being not illustrated.

The embodiment has been described above giving the ink-jet recording head as an example of the liquid-jet heads. Basic configurations of the liquid-head jets are not limited to that described above. The present invention is widely intended for overall liquid-head jets. Examples of liquid-jet head includes various recording heads used for image recording devices such as printers; color-material-jet heads used for manufacturing color filters of liquid crystal display devices and the like; electrode-material-jet heads used for forming electrodes of organic EL display devices, FED (Field Emission Display) devices and the like; bio-organic-substance-jet heads used for manufacturing bio-chips; and the like.

It goes without saying that the liquid-jet apparatus on which such a liquid-jet head is installed is also not particularly limited.

Furthermore, the present invention can be applied not only to a piezoelectric element constituting an actuator device installed in such a liquid-jet head as pressure generating means, but also to a piezoelectric element constituting an actuator device installed in each of various kinds of apparatuses. For example, the present invention can be applied to a sensor, or the like, in addition to the above-described head.

What is claimed is:

1. A piezoelectric element comprising:
   a lower electrode;
   an upper electrode; and
   a piezoelectric film which is made of lead zirconate titanate (PZT), and which has perovskite crystals having priority orientations of the (100) plane, the piezoelectric film being interposed between the lower electrode and the upper electrode, wherein a n diffraction peak position of X-ray derived from the (100) planes of the piezoelectric film is within a range of 2θ=21.79 to 21.88 degrees.

2. The piezoelectric element according to claim 1, wherein the diffraction peak position is 2θ=21.83 to 21.87 degrees.

3. The piezoelectric element according to claim 1, wherein the piezoelectric film has the rhombohedral crystal system structure.

4. The piezoelectric element according to claim 1, wherein the piezoelectric film contains at least any one selected from the group consisting of Sc, Y, Th, lanthanoids and actinoids.

5. A liquid-jet head comprising:
the piezoelectric element according to claim 1; and
a passage-forming substrate to which the piezoelectric element is provided with a vibration plate interposed in between, and in which a pressure generating chamber communicating with a nozzle orifice is provided.

6. A liquid-jet head comprising:
the piezoelectric element according to claim 2; and
a passage-forming substrate to which the piezoelectric element is provided with a vibration plate interposed in between, and in which a pressure generating chamber communicating with a nozzle orifice is provided.

7. A liquid-jet head comprising:
the piezoelectric element according to claim 3; and
a passage-forming substrate to which the piezoelectric element is provided with a vibration plate interposed in between, and in which a pressure generating chamber communicating with a nozzle orifice is provided.

8. A liquid-jet head comprising:
the piezoelectric element according to claim 4; and
a passage-forming substrate to which the piezoelectric element is provided with a vibration plate interposed in between, and in which a pressure generating chamber communicating with a nozzle orifice is provided.

9. A liquid-jet apparatus comprising:
the liquid-jet head according to claim 5.

10. The piezoelectric element according to claim 1, wherein the lower electrode is laminated on a layer which comprises perovskite.

* * * * *